US009177697B2

(12) United States Patent
Kato

(10) Patent No.: US 9,177,697 B2
(45) Date of Patent: Nov. 3, 2015

(54) FLAT CABLE AND ELECTRONIC DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 16 days.

(21) Appl. No.: 14/312,890

(22) Filed: Jun. 24, 2014

(65) Prior Publication Data
US 2014/0299355 A1 Oct. 9, 2014

Related U.S. Application Data

(63) Continuation of application No. PCT/JP2013/067596, filed on Jun. 27, 2013.

(30) Foreign Application Priority Data

Jun. 29, 2012 (JP) ................................. 2012-146584

(51) Int. Cl.
*H05K 1/00* (2006.01)
*H01B 7/08* (2006.01)
(Continued)

(52) U.S. Cl.
CPC .............. *H01B 7/0823* (2013.01); *H01P 3/085* (2013.01); *H01P 5/028* (2013.01); *H05K 1/0221* (2013.01); *H05K 1/028* (2013.01); *H05K 1/147* (2013.01)

(58) Field of Classification Search
CPC ............. H01B 7/08; H01P 3/06; H01P 3/085; H01P 3/088; H05K 1/0253; H05K 2201/0191
USPC ...... 174/250, 251, 255, 110 R, 113 R, 117 R, 174/117 F, 117 FF, 36
See application file for complete search history.

(56) References Cited

U.S. PATENT DOCUMENTS 7,940,144 B2 * 5/2011 Koch ........................ H01P 3/08
333/238
8,810,340 B2 * 8/2014 Kato ........................ H01P 3/00
333/238
(Continued)

FOREIGN PATENT DOCUMENTS

JP 2001-016007 A 1/2001
JP 2007-123740 A 5/2007
(Continued)

OTHER PUBLICATIONS

Official Communication issued in International Patent Application No. PCT/JP2013/067596, mailed on Aug. 20, 2013.

*Primary Examiner* — William H Mayo, III
(74) *Attorney, Agent, or Firm* — Keating & Bennett, LLP

(57) ABSTRACT

A transmission line section of a flat cable includes a dielectric element including a signal conductor at an intermediate position of a thickness direction, a first ground conductor, and a second ground conductor. The first ground conductor includes elongated conductors that are spaced apart from each other in a width direction of the dielectric element, and extend in a longitudinal direction, and bridge conductors that connect the elongated conductors at spaced points along the longitudinal direction. A widened portion having a width larger than the width of the elongated conductors is located at the intermediate position between bridge conductors that are adjacent to each other along the longitudinal direction. The widened portion is configured to project in a direction in which the elongated conductors are opposed to each other. An interlayer connection conductor is located in the widened portion. The first ground conductor and the second ground conductor are connected by the interlayer connection conductor.

19 Claims, 9 Drawing Sheets

(51) Int. Cl.
*H01P 3/08* (2006.01)
*H01P 5/02* (2006.01)
*H05K 1/02* (2006.01)
*H05K 1/14* (2006.01)

(56) References Cited

U.S. PATENT DOCUMENTS

| | | | |
|---|---|---|---|
| 8,957,325 B2* | 2/2015 | Hidaka | H05K 1/116 174/262 |
| 2012/0097433 A1 | 4/2012 | Kato et al. | |
| 2012/0274423 A1* | 11/2012 | Kato | H01P 1/20363 333/238 |
| 2013/0127560 A1 | 5/2013 | Kato et al. | |
| 2013/0147581 A1 | 6/2013 | Kato et al. | |
| 2014/0003007 A1* | 1/2014 | Shiroki | H01B 7/08 361/752 |

FOREIGN PATENT DOCUMENTS

| | | |
|---|---|---|
| JP | 2007-281145 A | 10/2007 |
| JP | 3173143 U | 1/2012 |
| WO | 2011/007660 A1 | 1/2011 |
| WO | 2012/073591 A1 | 6/2012 |
| WO | 2012/074100 A1 | 6/2012 |
| WO | 2012/074101 A1 | 6/2012 |

* cited by examiner cross-section along A-A cross-section along B-B cross-section along C-C

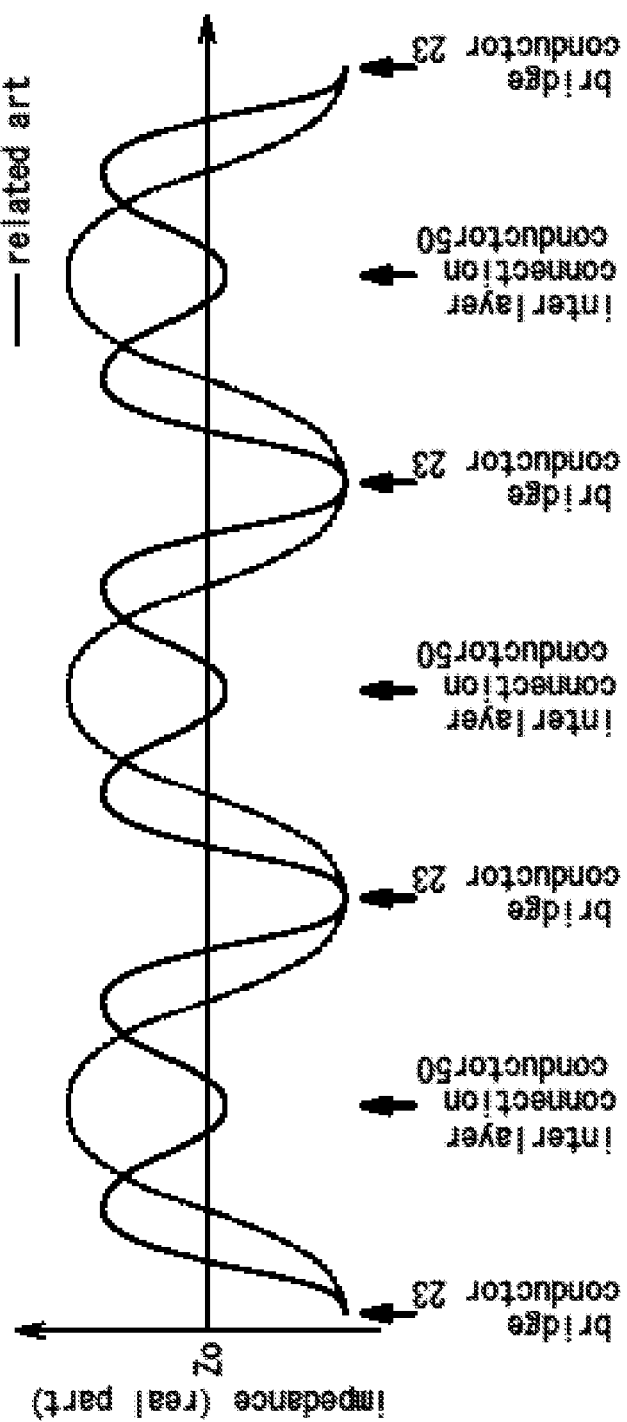

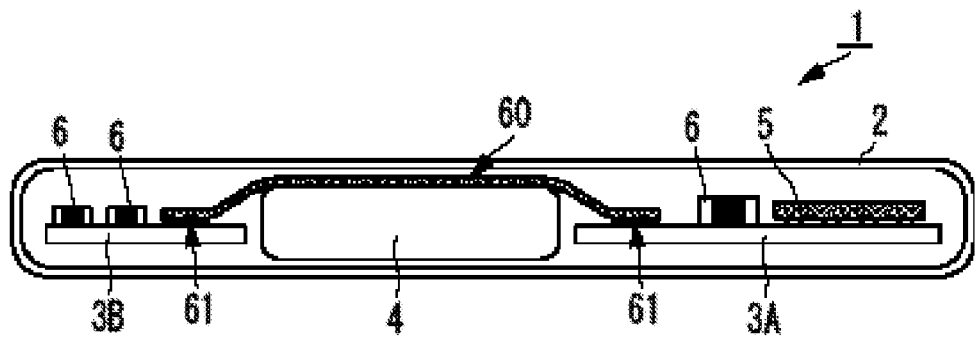
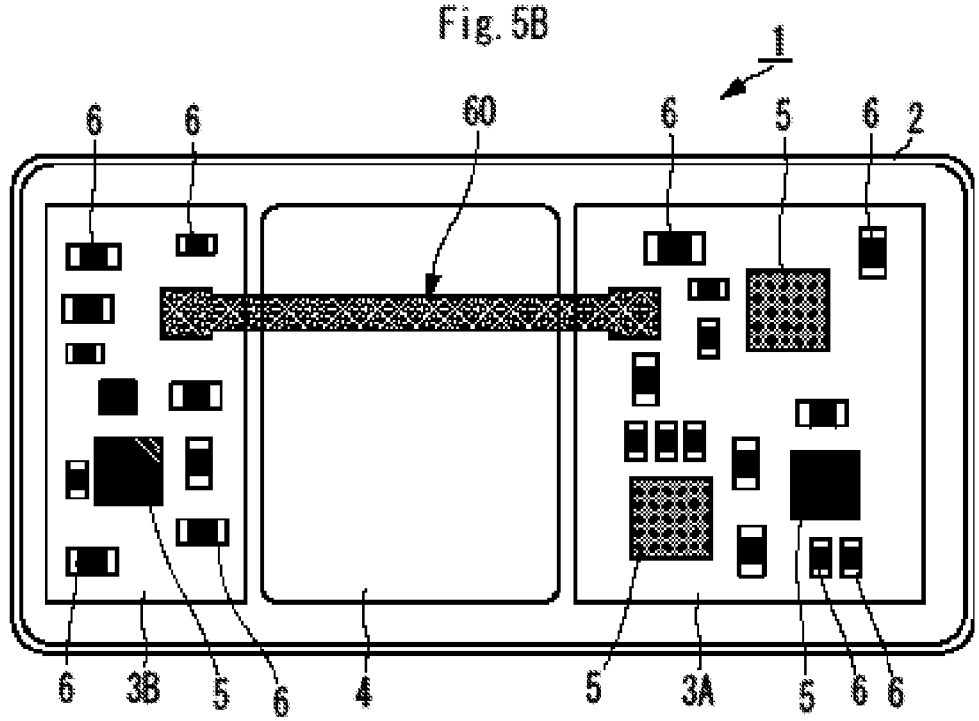

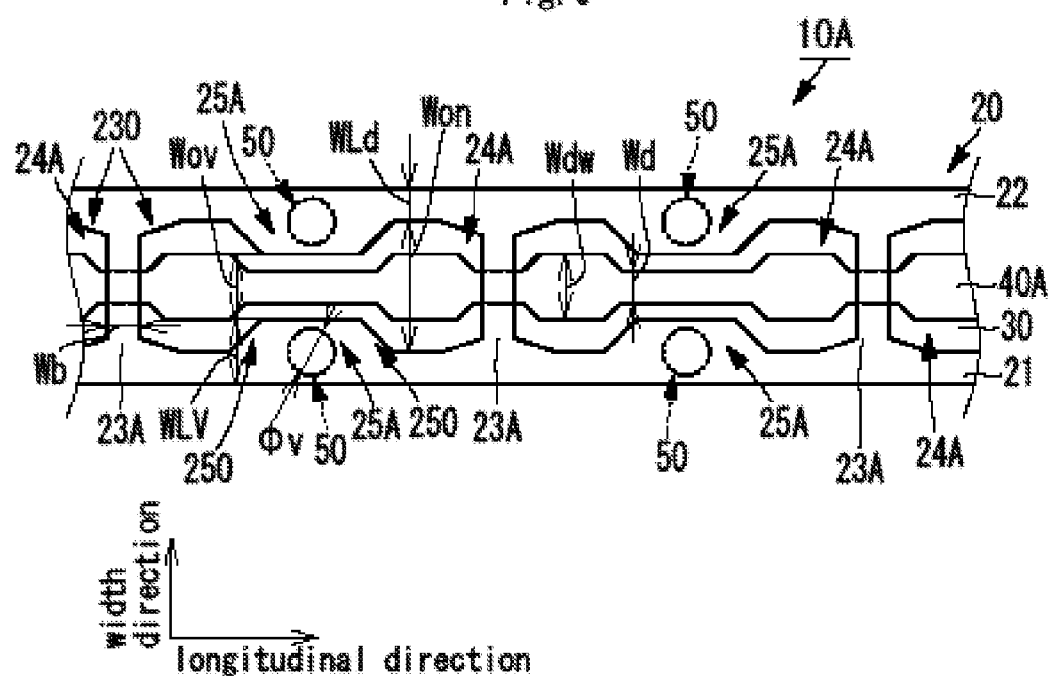

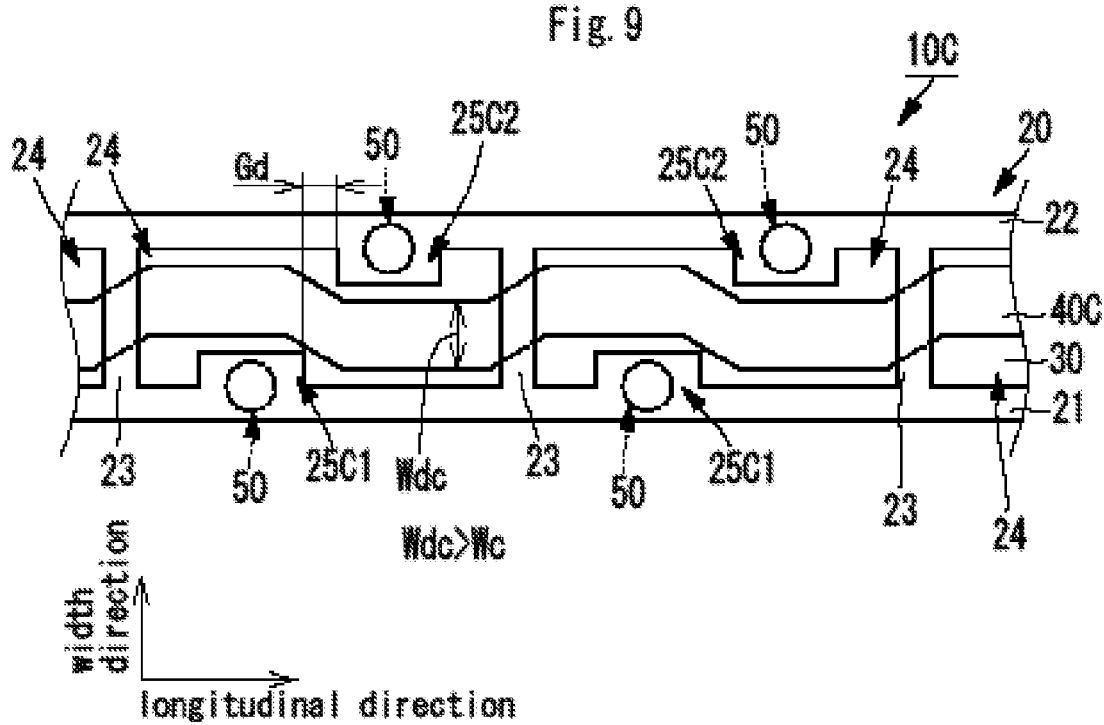

FLAT CABLE AND ELECTRONIC DEVICE

CROSS-REFERENCE TO RELATED APPLICATIONS

This application is a continuation application of PCT/JP2013/067596 filed Jun. 27, 2013, the contents of which are hereby incorporated by reference, which claims priority to Japanese patent application 2012-146584, the contents of which are hereby incorporated by reference.

BACKGROUND OF THE INVENTION

1. Field of the Invention

The present invention relates to a thin flat cable configured to transmit radio frequency signals, and an electronic device including the flat cable.

2. Description of Related Art

Conventionally, a coaxial cable exists as a typical example of radio frequency line for transmitting radio frequency signals. A coaxial cable includes a central conductor (signal conductor) shaped to extend in one direction (shaped to extend in the direction of signal transmission), and a shield conductor provided concentrically along the outer peripheral surface of the central conductor.

Incidentally, as radio frequency devices including mobile communications terminals have become increasingly smaller and thinner in recent years, it is not possible to secure a space for disposing a coaxial cable inside the terminal housing in some cases.

Accordingly, attention is being given to use of a flat cable as discussed in each of International Publication No. WO 2011/007660 and Japanese Registered Utility Model No. 3173143 for such a terminal housing. Although a flat cable has a larger width than a coaxial cable, a flat cable can be reduced in thickness, which proves particularly advantageous for cases such as when there is only a small gap inside the terminal housing.

The flat cable discussed in each of International Publication No. WO 2011/007660 and Japanese Registered Utility Model No. 3173143 has a tri-plate strip line structure as its basic structure.

The flat cable as discussed in each of International Publication No. WO 2011/007660 and Japanese Registered Utility Model No. 3173143 has a flat plate-like dielectric element having flexibility and an insulating property. The dielectric element has an elongated shape extending in a straight line. A second ground conductor is provided on a second surface orthogonal to the thickness direction of the dielectric element. The second ground conductor is a so-called solid conductor pattern that covers substantially the entire second surface of the dielectric element. A first conductor is provided on a first surface opposite to the second surface of the dielectric element. The first ground conductor includes elongated conductors, which are shaped to extend along the longitudinal direction, at both ends of the width direction that is orthogonal to the longitudinal direction and the thickness direction. The two elongated conductors are connected by bridge conductors. The bridge conductors are disposed at predetermined spacings along the longitudinal direction, and shaped to extend in the width direction. Consequently, the second ground conductor has a shape such that openings with a predetermined length are arranged along the longitudinal direction. The bridge conductors for forming these openings are generally disposed at regular spacings along the longitudinal direction.

A signal conductor with a predetermined width and a predetermined thickness is formed in the middle of the thickness direction of the dielectric element. The signal conductor has an elongated shape that extends in a direction parallel to the elongated conductors of the first ground conductor and the second ground conductor. The signal conductor is formed substantially at the center of the width direction of the dielectric element.

With the above-mentioned configuration, in plan view of the flat cable (when viewed in a direction orthogonal to the first surface and the second surface), the signal conductor is disposed so as to overlap the first ground conductor only in the location of the bridge conductors, and lie within the openings in other areas.

The flat cable as discussed in International Publication No. WO 2011/007660 and Japanese Registered Utility Model No. 3173143 includes interlayer connection conductors in order to provide electrical continuity between the first ground conductor and the second ground conductor. The interlayer connection conductors penetrate the dielectric element in the thickness direction. The interlayer connection conductors are formed in the connecting areas of the elongated conductors of the first ground conductor with the bridge conductors.

However, further reductions in width are desired for the thin flat cable as mentioned above. In order to ensure that a flat cable has the same characteristic impedance after being reduced in width as that before the reduction in width, it is necessary to narrow the width of the elongated conductors of the first ground conductor.

However, in the case of the structure in which the interlayer connection conductors formed by conductive vias are formed in the elongated conductors as mentioned above, the narrower width of the elongated conductors means that the diameter of the interlayer connection conductors also needs to be made smaller. The interlayer connection conductors are each formed by filling a through-hole or excavated hole with a conductive paste and then curing the conductive paste. Consequently, when the interlayer connection conductors have a small diameter, the interlayer connection conductors are susceptible to breakage from the stress exerted when the flat cable is bent. Moreover, the narrow width of the elongated conductors makes it difficult to form the through-hole or excavated hole at a predetermined position, leading to an increase in work load or a decrease in manufacturing yield. Further, in a case where the bridge conductors are narrow, the stress exerted on the interlayer connection conductors when the flat cable is bent is exerted on the bridge conductors located near the interlayer connection conductors having high hardness, which may cause the bridge conductors to break in some cases. As described above, with the conventional structure, narrowing the width of the flat cable leads to a decrease in the reliability of the flat cable.

SUMMARY OF THE INVENTION

Accordingly, preferred embodiments of the present invention provide a flat cable that does not decrease in reliability even when its width is narrowed, as compared with a case where the flat cable has a large width.

A flat cable according to a preferred embodiment of the present invention includes a dielectric element, a signal conductor, a first ground conductor, a second ground conductors, and an interlayer connection conductor. The dielectric element preferably is in the form of a flat plate, and configured to extend along the longitudinal direction. The signal conductor is disposed in the dielectric element, and configured to extend along the longitudinal direction. The first ground conductor is located on a surface at one end of the thickness direction of the dielectric element, and configured to extend along the longitudinal direction. The second ground conductor is located on a surface at the other end of the thickness direction of the dielectric element, and configured to extend along the longitudinal direction. The interlayer connection conductor is configured to extend in the thickness direction of the dielectric element, and connects the first ground conductor and the second ground conductor.

The first ground conductor includes two elongated conductors that are spaced from each other at opposite ends of the width direction, a plurality of bridge conductors that connect the two elongated conductors at spaced points along the longitudinal direction, and a widened portion that is located at a predetermined position between the bridge conductors along the longitudinal direction in each of the elongated conductors, the widened portion being widened in a direction in which the two elongated conductors are opposed to each other. The interlayer connection conductor is provided in the widened portion.

According to this configuration, the interlayer connection conductor is provided in the widened portion provided in each of the elongated conductors. Therefore, the diameter of the interlayer connection conductor is large. In this regard, the widened portion is configured to widen in a direction in which the elongated conductors are opposed to each other, in other words, toward the center of the width direction of the flat cable. Therefore, the width of the flat cable does not increase.

Preferably, the widened portion of the flat cable according to a preferred embodiment of the present invention includes an enlarged portion. The enlarged portion becomes gradually wider along the longitudinal direction from the width of each of the elongated conductors to the width of the widened portion.

According to this configuration, an abrupt change in characteristic impedance in the widened portion is prevented, and transmission loss is significantly reduced. In addition, since the area over which the interlayer connection conductor is provided becomes larger, the interlayer connection conductor is formed more easily.

Preferably, the widened portion of the flat cable according to a preferred embodiment of the present invention is located at substantially the midpoint position of the bridge conductors that are adjacent to each other along the longitudinal direction.

According to this configuration, the interlayer connection conductor that connects to the ground is disposed at the intermediate position between the bridge conductors where the maximum value of characteristic impedance occurs. Therefore, the maximum value is significantly reduced or minimized. As a result, characteristic impedance is adjusted. Further, it is possible to significantly reduce or prevent the occurrence of an unwanted standing wave having a low frequency determined by the position of the maximum value of characteristic impedance.

In the flat cable according to a preferred embodiment of the present invention, a position along the longitudinal direction of the widened portion included in the first elongated conductor may differ from a position along the longitudinal direction of the widened portion included in the second elongated conductor.

According to this configuration, even though the widened portion is provided, the two elongated conductors can be separated from each other by a predetermined spacing or more at any position along the longitudinal direction. As a result, the width of the signal conductor is made large, thus improving transmission loss.

Preferably, the interlayer connection conductor of the flat cable according to a preferred embodiment of the present invention has a diameter larger than the width of each of the elongated conductors.

This configuration describes a specific numerical example of the diameter of the interlayer connection conductor. Because the interlayer connection conductor can be made larger in diameter than the elongated conductors, it is easy to form the elongated conductors, and also the difference in potential between the first ground conductor and the second ground conductor is eliminated more reliably. In addition, breakage due to bending of the flat cable does not easily occur.

Each of the bridge conductors of the flat cable according to a preferred embodiment of the present invention may have a width smaller than the width of each of the elongated conductors.

According to this configuration, because the bridge conductors preferably have a small width, the inductance of the bridge conductors is large. As a result, the characteristic impedance is adjusted over a wider range. In addition, because the width of the signal conductor opposed to the bridge conductors in the thickness direction is increased, conductor loss of the signal conductor is significantly reduced.

Preferably, in the flat cable according to a preferred embodiment of the present invention, the signal conductor has a width that is smaller in locations close to each of the bridge conductors and the widened portion of each of the elongated conductors than in other locations.

According to this configuration, an increase in the capacitive property in locations close to the bridge conductors and the elongated conductors is significantly reduced or minimized, thus enabling an adjustment to provide a desired characteristic impedance.

The flat cable according to a preferred embodiment of the present invention may include a connector member that connects to the signal conductor, the connector member being provided at least at one end of the longitudinal direction.

According to this configuration, the provision of the connector member allows the flat cable to be easily connected to an external circuit board or the like.

Further, another preferred embodiment of the present invention provides an electronic device including any one of the flat cables according to preferred embodiments described above, a plurality of mounting circuit boards that are connected by the flat cable, and a housing in which the mounting circuit boards are built.

This configuration describes an electronic device using the flat cable mentioned above. By using the flat cable mentioned above, regardless of how the plurality of mounting circuit boards disposed inside the housing are connected, RF signals are transmitted between the mounting circuit boards without causing an increase in transmission loss.

According to various preferred embodiments of the present invention, it is possible to realize a flat cable that has high reliability and has a small width.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 illustrates the distribution of characteristic impedance along the longitudinal direction of the flat cable according to the first preferred embodiment of the present invention.

FIGS. 5A and 5B are a side cross-sectional view and a plan cross-sectional view, respectively, each illustrating a configuration of the components of a portable electronic device according to the first preferred embodiment of the present invention.

FIG. 6 is a plan view illustrating a portion of a transmission line section of a flat cable according to a second preferred embodiment of the present invention.

FIG. 9 is a plan view illustrating a portion of the transmission line section of the flat cable according to the fourth preferred embodiment of the present invention.

DETAILED DESCRIPTION OF THE PREFERRED EMBODIMENTS

Figure 1:
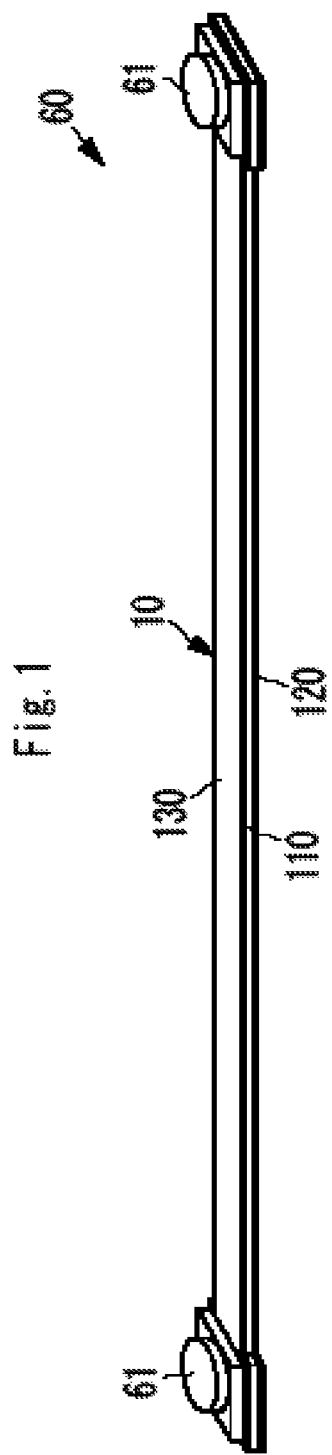
FIG. 1 is an external perspective view of a flat cable according to a first preferred embodiment of the present invention.
Figure 2:
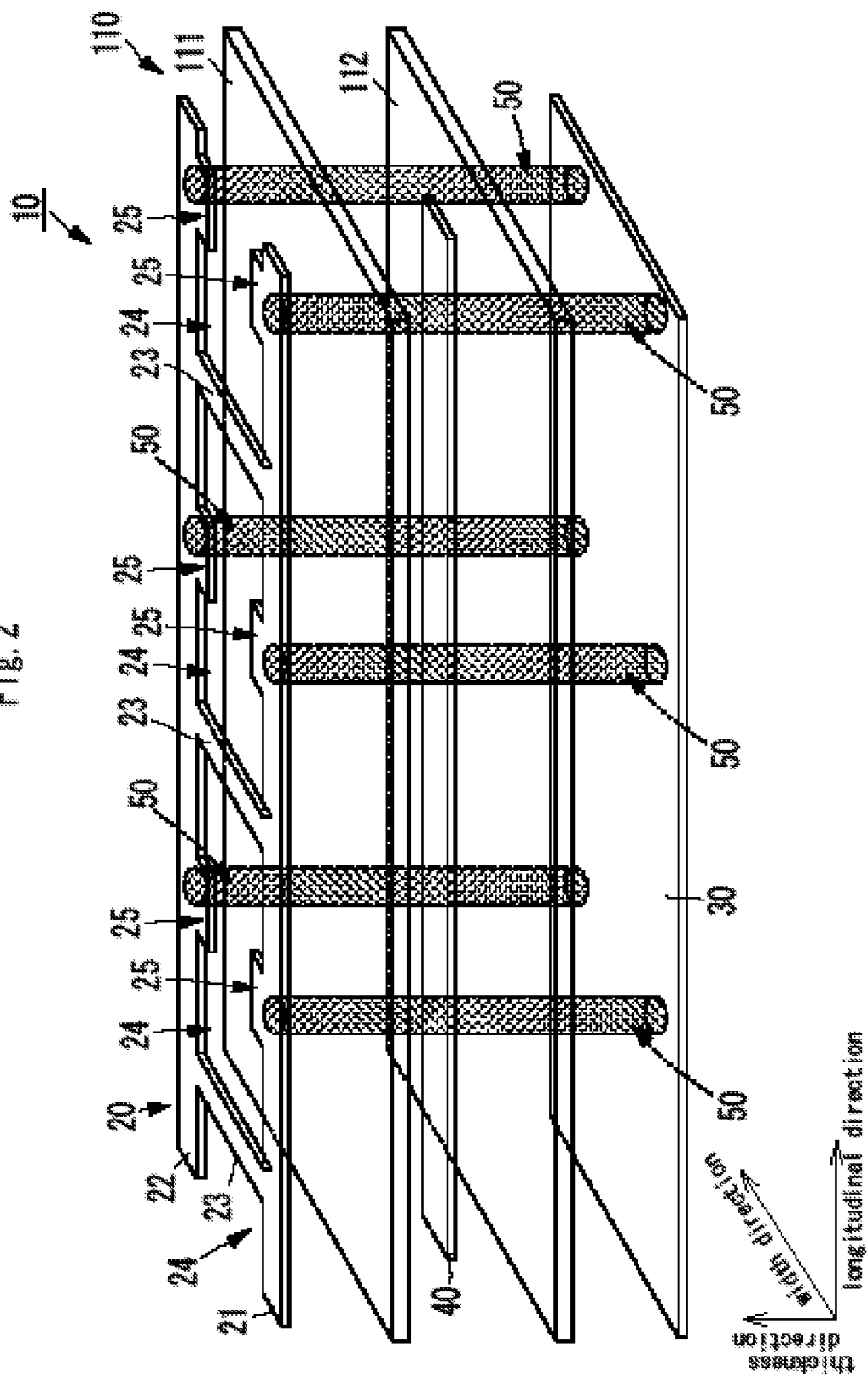
FIG. 2 is an exploded perspective view illustrating a portion of a transmission line section.
Figure 3A:
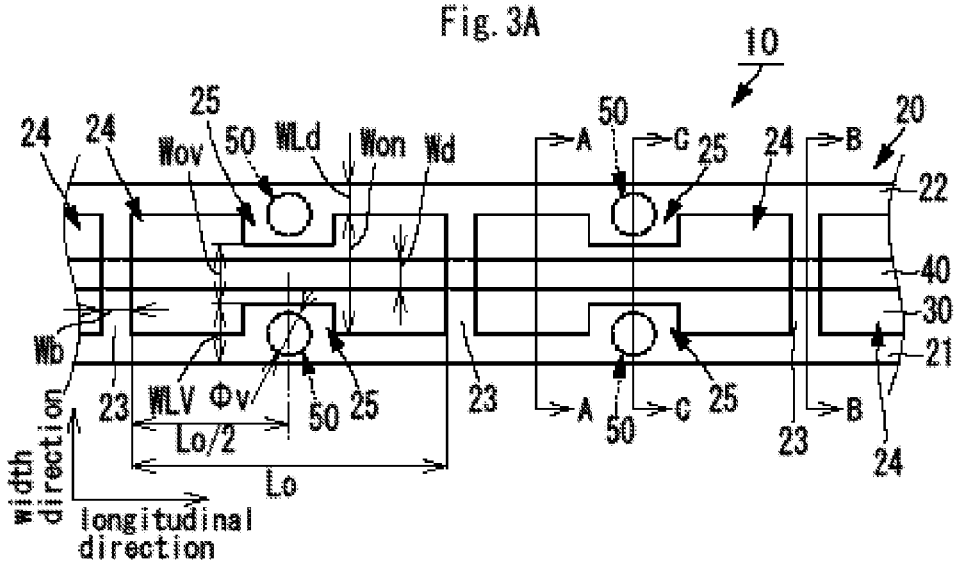
FIGS. 3A to 3D are a plan view and cross-sectional views, respectively, each illustrating a portion of the transmission line section.
Figure 3B:
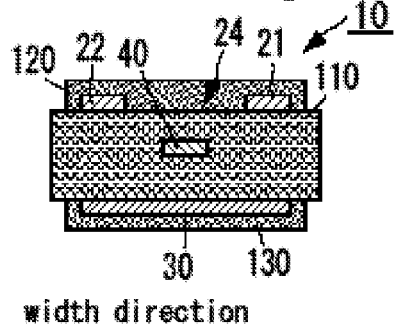
Figure 3C:
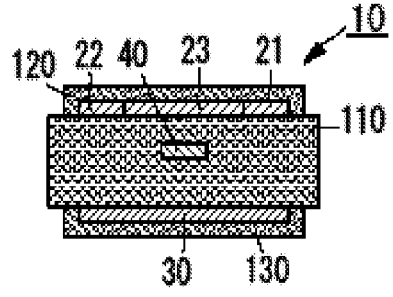
Figure 3D:
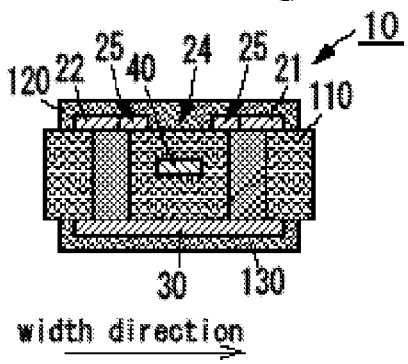

A flat cable according to a first preferred embodiment of the present invention will be described with reference to figures. FIG. 1 is an external perspective view of a flat cable according to the first preferred embodiment of the present invention. FIG. 2 is an exploded perspective view illustrating a portion of a transmission line section. FIGS. 3A, and 3B to 3D are a plan view and cross-sectional views, respectively, each illustrating a portion of the transmission line section. FIG. 3A is a plan view of a transmission line section 10 as seen from the first principal surface side, with a dielectric element 110 omitted. FIG. 3B illustrates a cross-section along A-A of FIG. 3A, and FIG. 3C illustrates a cross-section along B-B of FIG. 3A. FIG. 3D illustrates a cross-section along C-C of FIG. 3A. FIG. 3A is a plan view of the transmission line section 10 as seen from the first principal surface side, with a dielectric element omitted.

The flat cable 60 includes the transmission line section 10, and two coaxial connectors 61. The transmission line section 10 preferably has a flat plate-shaped configuration and an elongated shape. The two coaxial connectors 61 are located at opposite longitudinal ends of the transmission line section 10. The coaxial connectors 61 are located on the second principal surface (corresponding to the other surface according to the present invention) side of the transmission line section 10. A central conductor (not illustrated) of each of the coaxial connectors 61 is connected to an end portion of a signal conductor 40 (see FIGS. 2 and 3) of the transmission line section 10. Further, an external conductor (not illustrated) of each of the coaxial connectors 61 is connected to a second ground conductor 30 of the transmission line section 10.

The coaxial connectors 61 may be omitted, and may not be coaxial. In a case where the coaxial connectors 61 are omitted, the signal conductor 40, and a first ground conductor and the second ground conductor 30 may be exposed to the outside in the vicinity of both ends of the transmission line section 10. The coaxial connectors 61 may be located on different surfaces. For example, the coaxial connector 61 at one end may be located on the first principal surface side, and the coaxial connector 61 at the other end may be located on the second principal surface side.

The outward appearance of the transmission line section 10 is such that the dielectric element 110 having a flat plate-shaped configuration is sandwiched by a protective layer 120 and a protective layer 130 from both ends of the thickness direction of the dielectric element 110. Specifically, on the first principal surface side corresponding to one end surface of the thickness direction of the dielectric element 110, the protective layer 120 is provided over substantially the entire surface of the dielectric element 110. On the second principal surface side corresponding to the other end surface of the thickness direction of the dielectric element 110, the protective layer 130 is provided over substantially the entire surface of the dielectric element 110.

The transmission line section 10 includes the dielectric element 110 preferably having an elongated flat plate-shaped configuration. The dielectric element 110 is made from, for example, a flexible material having insulating property such as polyimide or liquid crystal polymer.

The signal conductor 40 preferably has a flat film-shaped configuration, and is located substantially at the center of the thickness direction of the dielectric element 110. A width Wd of the signal conductor 40 is preferably set so that a desired characteristic impedance is obtained for the transmission line section 10. Further, the width Wd of the signal conductor 40 is smaller than a spacing Won in the width direction of elongated conductors 21 and 22 constituting the first ground conductor 20 described later. More specifically, the width Wd of the signal conductor 40 is smaller than a spacing Wov in the width direction between respective widened portions 25 included in the elongated conductors 21 and 22.

The signal conductor 40 is included in the middle of the thickness direction of the dielectric element 110. The position of the signal conductor 40 in the thickness direction is set so that a desired characteristic impedance is obtained for the transmission line section 10. The signal conductor 40 preferably is made of a material with high electrical conductivity, for example, copper (Cu).

The first ground conductor 20 is located on the first principal surface of the dielectric element 110. The first ground conductor 20 includes the elongated conductors 21 and 22 and a plurality of bridge conductors 23. The first ground conductor 20 is also made of a material with high electrical conductivity, for example, copper (Cu).

The elongated conductors 21 and 22 have an elongated shape extending along the longitudinal direction of the dielectric element 110. The elongated conductor 21 is located at one end of the width direction of the dielectric element 110, and the elongated conductor 22 is located at the other end of the width direction of the dielectric element 110. The elongated conductors 21 and 22 are located at a predetermined spacing along the width direction of the dielectric element 110.

The bridge conductors 23 are configured to extend in the width direction of the dielectric element 110. The plurality of bridge conductors 23 are located at spaced points along the longitudinal direction of the dielectric element 110. As a result, as viewed in a direction orthogonal to the first principal surface side (as viewed along the thickness direction), an opening 24 is located between the bridge conductors 23.

In this way, the first ground conductor 20 has a ladder-shaped configuration extending in the longitudinal direction.

Further, the first ground conductor 20 includes the widened portion 25 at a predetermined position in the longitudinal direction of each of the elongated conductors 21 and 22.

The widened portion 25 has a width WLV larger than a width WLd of the elongated conductors 21 and 22. A width Wov between the respective widened portions 25 of the elongated conductors 21 and 22 is determined by the width WLV.

The widened portion 25 is located at substantially the intermediate position of adjacent bridge conductors 23 along the longitudinal direction of the elongated conductors 21 and 22. In other words, the widened portion 25 is located at substantially the middle position along the longitudinal direction of the opening 24 of the first ground conductor 20. For example, letting Lo be the length along the longitudinal direction of the opening 24, the widened portion 25 is configured so that the spacing between the center position of the longitudinal direction of the widened portion 25, and an end portion of the longitudinal direction of the opening 24 is Lo/2.

The widened portion 25 preferably has a shape that projects in such a way that the elongated conductors 21 and 22 are opposed to each other along the width direction. In other words, the widened portion 25 preferably has a shape that projects toward the center of the width direction of the transmission line section 10 (flat cable 60). Consequently, the provision of the widened portion 25 does not cause the width of the transmission line section 10 to increase.

The length along the longitudinal direction of the widened portion 25 is larger than a width (length along the longitudinal direction) Wb of the bridge conductors 23. Further, as a more specific design value, the length along the longitudinal direction of the widened portion 25 is set as appropriate on the basis of the diameter φ of an interlayer connection conductor 50 that connects the first ground conductor 20 and the second ground conductor 30. For example, the length along the longitudinal direction of the widened portion 25 is set to a value equal to the diameter φ of the interlayer connection conductor 50 plus a manufacturing error for the interlayer connection conductor 50.

The second ground conductor 30 is located on the second principal surface of the dielectric element 110. The second ground conductor 30 is provided over the entire surface of the dielectric element 110. The second ground conductor 30 is also made of a material with high electrical conductivity, for example, copper (Cu).

The interlayer connection conductor 50 is a so-called conductive via conductor, which is a conductor penetrating the dielectric element 110 in the thickness direction. The interlayer connection conductor 50 is preferably formed by filling a through-hole formed in the dielectric element 110 with a conductive paste, and then curing the conductive paste. Consequently, the interlayer connection conductor 50 connects the first ground conductor 20 and the second ground conductor 30.

The interlayer connection conductor 50 is included in the widened portion 25 of each of the elongated conductors 21 and 22 of the first ground conductor 20. The diameter φ of the interlayer connection conductor 50 is shorter than the width WLV and length along the longitudinal direction of the widened portion 25. In this regard, preferably, the diameter φ of the interlayer connection conductor 50 is larger than the width Wb of the bridge conductors 23. Preferably, the interlayer connection conductor 50 is configured such that the center of the interlayer connection conductor 50 in plan view substantially coincides with the center of the widened portion 25 in plan view.

This configuration makes it possible to realize a so-called tri-plate transmission line having such a shape that the signal conductor 40 included inside the dielectric element 110 is sandwiched by the first ground conductor 20 and the second ground conductor 30. Then, for the tri-plate transmission line configured in this way, as mentioned above, the protective layer 120 is located on the first principal surface side of the dielectric element 110, and the protective layer 130 is located on the second principal surface side of the dielectric element 110. As a result, the transmission line section 10 according to this preferred embodiment is realized.

By using the configuration according to this preferred embodiment, even when the width WLd of the elongated conductors 21 and 22 is made small, the interlayer connection conductor 50 can be provided without making its diameter smaller. As a result, the interlayer connection conductor 50 with a large diameter can be provided even when the width of the transmission line section 10 is narrowed.

Further, with the configuration according to this preferred embodiment, the diameter φ of the interlayer connection conductor 50 is made large. Therefore, the interlayer connection conductor 50 does not easily break even when the transmission line section 10 is bent. Moreover, the stress exerted on the bridge conductors 23, which is generated when the transmission line section 10 is bent if the interlayer connection conductor 50 is disposed in close proximity to the bridge conductors 23, decreases. As a result, breakage of the bridge conductors 23 is reliably prevented or minimized.

The large diameter φ of the interlayer connection conductor 50 lowers the resistance of the interlayer connection conductor 50, which makes it possible to provide the connection between the first ground conductor 20 and the second ground conductor 30 with lower resistance. Therefore, the difference in potential between the second ground conductor 30 that is a main ground, and the first ground conductor 20 that is an auxiliary ground can be set to substantially "0", thus realizing an ideal ground with which the first ground conductor 20 and the second ground conductor 30 are at the same or substantially the same potential.

Although the diameter φ of the interlayer connection conductor 50 is preferably larger than the width WLd of the elongated conductors 21 and 22, the diameter φ can be also set equal to or smaller than the width WLd. Further, although the diameter φ of the interlayer connection conductor 50 is preferably larger than the width Wb of the bridge conductors 23, the diameter φ can be also set equal to or smaller than the width Wb. These configurations also provide the operational effect of preventing or minimizing breakage of the bridge conductors 23.

The interlayer connection conductor 50 is not only included in the widened portion 25 but can be also additionally included in, for example, an area where each of the bridge conductors 23 connects with the elongated conductor 21 or 22. However, by providing the interlayer connection conductor 50 only in the widened portion 25 as in the configuration according to this preferred embodiment, the width of the bridge conductors is set without regard to the diameter φ of the interlayer connection conductor 50. As a result, the width Wb of the bridge conductors 23 are narrowed. Therefore, the inductance of the bridge conductors 23 is increased, thus allowing the inductance of the bridge conductors 23 to be set over a wider range. As a result, a desired characteristic impedance is achieved more easily.

Although the widened portion 25 and the interlayer connection conductor 50 are preferably located at substantially the intermediate position of the longitudinal direction of the bridge conductors 23, their positions may be displaced from this position along the longitudinal direction.

In particular, the following operational effect is attained in a case where the widened portion 25 and the interlayer connection conductor 50 are located at substantially the intermediate position of the longitudinal direction of the bridge conductors 23. FIG. 4 illustrates the distribution of characteristic impedance along the longitudinal direction of the flat cable according to the first preferred embodiment of the present invention. In FIG. 4, the solid line indicates the characteristic impedance of the flat cable according to this preferred embodiment, and the dotted line indicates the characteristic impedance of a flat cable according to related art. As illustrated in FIG. 4, in each of the flat cables according to this preferred embodiment and related art, basically, the characteristic impedance has periodicity in accordance with the spacing of the bridge conductors 23, and is set so as to become a desired characteristic impedance Zo as a whole.

Specifically, in the flat cable having a structure according to related art, as indicated by the dotted line in FIG. 4, the inductance becomes maximum at the middle position of the opening 24 (the intermediate position between the bridge conductors 23). Accordingly, the characteristic impedance also becomes maximum at the middle position of the opening 24.

In this regard, in a case where the configuration according to this preferred embodiment is used, in the portion where the widened portion 25 and the interlayer connection conductor 50 are provided, the distance between each of the widened portion 25 and the interlayer connection conductor 50, and the signal conductor 40 is smaller than in the portion of the elongated conductors 21 and 22 where the widened portion 25 is not provided. Therefore, in the portion where the widened portion 25 and the interlayer connection conductor 50 are provided, the capacitive coupling between each of the widened portion 25 and the interlayer connection conductor 50, and the signal conductor 40 becomes stronger than in the portion of the elongated conductors 21 and 22 where the widened portion 25 is not provided. That is, the C-property becomes strong.

Because the C-property at the middle position of the opening 24 is increased in this way, as indicated by the solid line in FIG. 4, a depression where characteristic impedance decreases is formed at the position of maximum characteristic impedance. As a result, the maximum value of characteristic impedance is significantly reduced. Further, this reduced value can be adjusted by the shapes of the widened portion 25 and interlayer connection conductor 50. Therefore, by using the configuration according to this preferred embodiment, the adjustment range to achieve a desired characteristic impedance is increased, thus making it easier to achieve a desired characteristic impedance.

An unwanted standing wave occurs depending on the interval of the maximum value of this characteristic impedance. However, by using the configuration according to this preferred embodiment, the maximum value of characteristic impedance is significantly reduced, thus preventing or minimizing the occurrence of an unwanted standing wave. In this regard, for example, depending on the interval of the maximum value of characteristic impedance (depending on the length of the opening), there are cases where the frequency of an unwanted standing wave becomes closer to the frequency of a radio frequency signal transmitted by the transmission line section 10, causing deterioration of the signal to noise ratio, or the like. Occurrence of such a problem is reliably prevented or minimized. This problem can be also solved by adjusting the positions at which to dispose the widened portion 25 and the interlayer connection conductor 50.

The flat cable having the above-mentioned structure is manufactured as follows, for example.

For example, a first insulating sheet with copper clad on two sides, and a second insulating sheet with copper clad on one side are prepared.

The first ground conductor 20 including the elongated conductors 21 and 22, the bridge conductors 23, and the widened portion 25 is formed by a so-called patterning process on the first principal surface side of the first insulating sheet. The signal conductor 40 is formed by a patterning process on the second principal surface side of the first insulating sheet. At this time, a plurality of sets of such first ground conductors 20 and signal conductors 40 are arranged on the first insulating sheet.

The second ground conductor 30 is formed by a so-called patterning process on the second principal surface side of the second insulating sheet. At this time, a plurality of such second ground conductors 30 are arranged on the second insulating sheet.

The first insulating sheet and the second insulating sheet are bonded together so that each of the first ground conductors 20 and each of the second ground conductors 30 are opposed to each other. At this time, the first insulating sheet and the second insulating sheet are bonded together so that the signal conductor 40 is located between the first insulating sheet and the second insulating sheet. As a result, a plurality of composites are obtained, each of which has the first ground conductor 20 and the second ground conductor 30 formed on both surfaces of a dielectric element with the signal conductor 40 provided at the intermediate position of the thickness direction.

A hole is formed with laser or the like in a portion of each of these composites where the widened portion 25 is formed. The hole formed in this way is filled with a conductive paste containing metal powder of copper, silver, or the like as its main component, and this conductive paste is sintered by heat treatment, thus forming the interlayer connection conductor 50. At this time, owing to the large area of the widened portion as mentioned above, displacement of the hole formed with laser from the widened portion 25 is prevented or minimized. Thus, the hole is formed easily. Moreover, the large diameter because $\phi$ of the interlayer connection conductor 50 makes filling of the conductive paste easy. In this way, by using the configuration according to this preferred embodiment, the interlayer connection conductor 50 is formed easily.

Each individual transmission line section 10 is cut out from this composite. The protective layers 120 and 130 are formed on the transmission line section 10. The coaxial connectors 61 are placed at opposite longitudinal ends of the transmission line section 10, and on the surface located on the side of the transmission line section 10 which is provided with the protective layer 130.

The flat cable 60 having the above-mentioned structure can be used for a portable electronic device as described below, for example. FIG. 5A is a side cross-sectional view illustrating a configuration of the components of a portable electronic device according to the first preferred embodiment of the present invention. FIG. 5B is a plan cross-sectional view for explaining the configuration of the components of the portable electronic device.

A portable electronic device 1 includes a thin device housing 2. Mounting circuit boards 3A and 3B, and a battery pack 4 are disposed inside the device housing 2. A plurality of IC chips 5 and mounting components 6 are mounted on the surfaces of the mounting circuit boards 3A and 3B. The mounting circuit boards 3A and 3B and the battery pack 4 are placed in the device housing 2 so that, in plan view of the device housing 2, the battery pack 4 is disposed between the mounting circuit boards 3A and 3B. Because the device housing 2 is made as thin as possible, the space between the battery pack 4 and the device housing 2 is very narrow in the thickness direction of the device housing 2. Therefore, the coaxial cable cannot be disposed in this space. The flat cable 60 is used to connect an antenna element and a feeder circuit.

However, by disposing the flat cable 60 according to this preferred embodiment so that the thickness direction of the flat cable 60 coincides with the thickness direction of the device housing 2, the flat cable 60 can be passed between the battery pack 4 and the device housing 2. As a result, the mounting circuit boards 3A and 3B that are spaced apart from each other with the battery pack 4 therebetween are connected by the flat cable 60.

Further, by using the flat cable 60 having the configuration according to this preferred embodiment, the width of the flat cable 60 is narrowed. As a result, the area in which the flat cable 60 is routed is made small, thus securing a larger electronic component mounting area on the surface of the battery pack, for example.

Next, a flat cable according to a second preferred embodiment of the present invention will be described with reference to a figure. FIG. 6 is a plan view illustrating a portion of a transmission line section of the flat cable according to the second preferred embodiment of the present invention. In FIG. 6, the dielectric element is not illustrated.

A transmission line section 10A of the flat cable according to this preferred embodiment differs from the transmission line section 10 according to the first preferred embodiment in the structures of a widened portion 25A, bridge conductors 23A, and a signal conductor 40A. Otherwise, the transmission line section 10A preferably is of the same configuration as the transmission line section 10 according to the first preferred embodiment. Therefore, only the differences from the transmission line section 10 according to the first preferred embodiment will be described.

The widened portion 25A includes an enlarged portion 250 at either end along the longitudinal direction of the transmission line section 10A. The enlarged portion 250 preferably has a shape such that the amount of its projection from the elongated conductor 21 or 22 increases with increasing proximity to the widened portion 25, and the amount of its projection from the elongated conductor 21 or 22 decreases with increasing proximity to the bridge conductors 23. The length along the longitudinal direction of the enlarged portion 250 may be set as appropriate. This structure makes it possible to prevent characteristic impedance from changing abruptly at the boundary between an area where the widened portion 25A is located and an area where the widened portion 25A is not located. As a result, transmission loss is significantly reduced.

Because the area in which the interlayer connection conductor 50 can be located becomes larger, the interlayer connection conductor 50 is formed more easily. In addition, characteristic impedance is preferably set over a wider range, thus making it easier to achieve a desired characteristic impedance.

The bridge conductors 23A preferably have a shape whose width (length along the longitudinal direction of the transmission line section 10A) increases with increasing proximity to the ends that connect with the elongated conductors 21 and 22. This shape makes it possible to prevent characteristic impedance from changing abruptly at the boundary between a portion where each of the bridge conductors 23A is placed and an opening 24A. As a result, transmission loss is significantly reduced. In addition, in a case where an auxiliary interlayer connection conductor is to be provided in the connecting area between each of the bridge conductors 23A and the elongated conductor 21 or 22, the auxiliary interlayer connection conductor is provided over a large area. As a result, the interlayer connection conductor is formed easily. In addition, the diameter of this auxiliary interlayer connection conductor is made large.

In the signal conductor 40A, as compared with the width of an area opposed to the bridge conductors 23A, and the width Wd of an area located at the same position as the widened portion 25A along the longitudinal direction, a width Wdw of other areas is larger. This configuration makes it possible to reduce the radio frequency resistance of the signal conductor 40A. As a result, conductor loss of the transmission line section 10A is significantly reduced. In addition, conversely, by narrowing the width of the area opposed to the bridge conductors 23A, and the width Wd of the area located at the same position as the widened portion 25A along the longitudinal direction, an increase in capacitive property in locations close to the bridge conductors 23A and the widened portion 25A is prevented or minimized. As a result, a desired characteristic impedance can be achieved.

Figure 7:
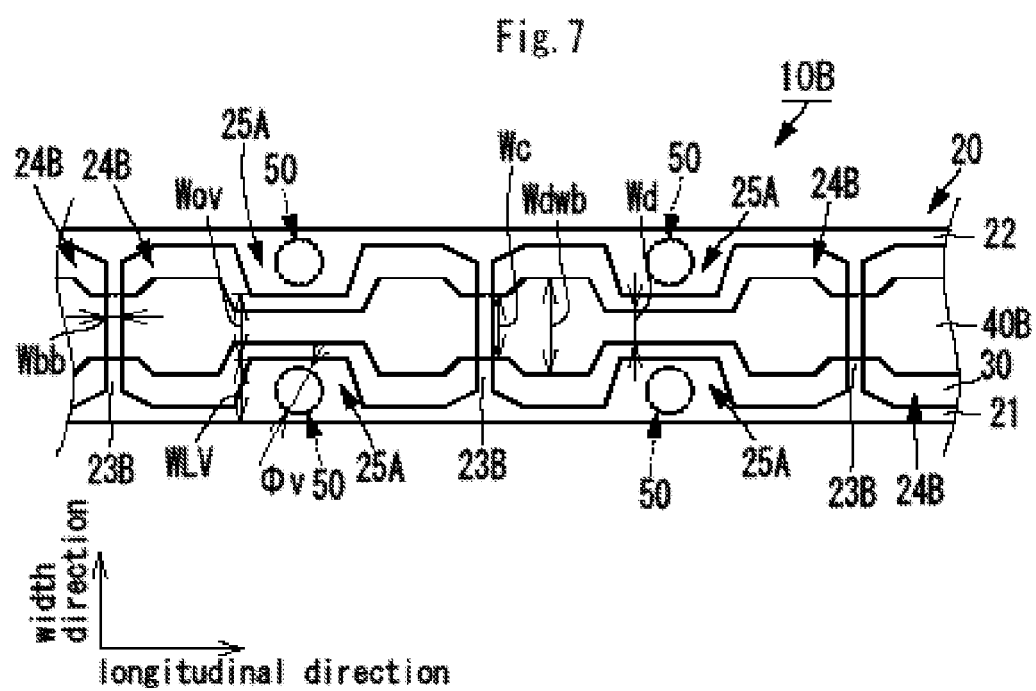
FIG. 7 is a plan view illustrating a portion of a transmission line section of a flat cable according to a third preferred embodiment of the present invention.

Next, a flat cable according to a third preferred embodiment of the present invention will be described with reference to a figure. FIG. 7 is a plan view illustrating a portion of a transmission line section of the flat cable according to the third preferred embodiment of the present invention. In FIG. 7, the dielectric element is not illustrated.

A transmission line section 10B of the flat cable according to this preferred embodiment differs from the transmission line section 10A according to the second preferred embodiment in the structures of bridge conductors 23B, and a signal conductor 40B. Otherwise, the transmission line section 10B preferably is of the same configuration as the transmission line section 10A according to the second preferred embodiment. Therefore, only the differences from the transmission line section 10A according to the second preferred embodiment will be described.

A width Wbb of the bridge conductors 23B is narrower in accordance with the desired impedance. As a result, an inductance that cannot be achieved by the structures according to related art or the preferred embodiments mentioned above is achieved. Therefore, characteristic impedance is set over a wider range.

The signal conductor 40B has a large width We in an area opposed to each of the bridge conductors 23B. For example, as illustrated in FIG. 7, the width We of the area opposed to each of the bridge conductors 23B is larger than the width Wd of an area located at the same position as the widened portion 25, and is smaller than a width Wdwb of other areas. This structure also allows the width of the bridge conductors 23B to be narrowed, thus making it possible to set the capacitance generated between each of the bridge conductors 23B and the signal conductor 40B to a desired value. Further, the increased width of the signal conductor 40B enables a further reduction in the radio frequency resistance of the signal conductor 40B. As a result, conductor loss of the transmission line section 10B is further reduced.

Figure 8:
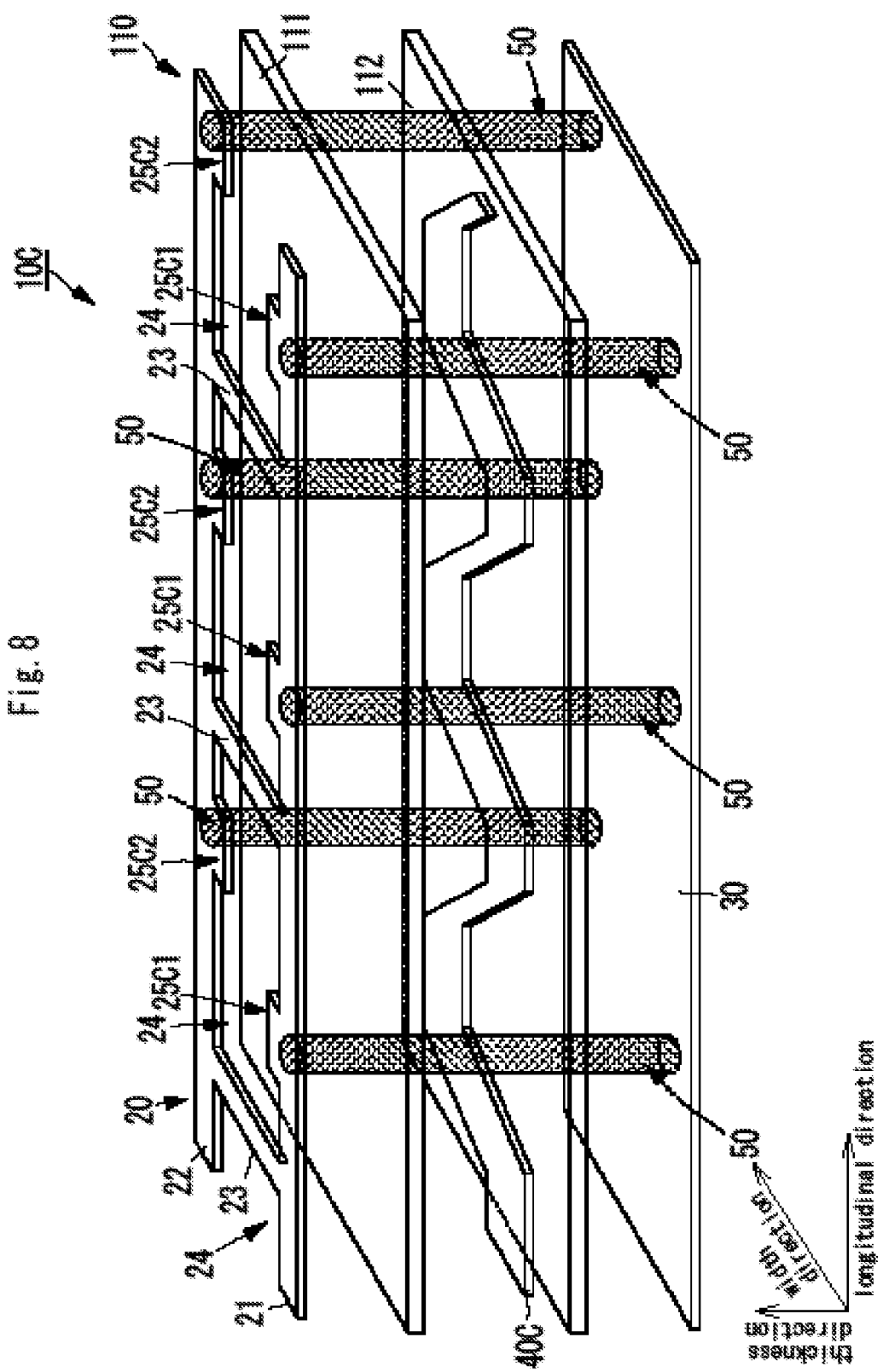
FIG. 8 is an exploded perspective view illustrating a portion of a transmission line section of a flat cable according to a fourth preferred embodiment of the present invention.

Next, a flat cable according to a fourth preferred embodiment of the present invention will be described with reference to figures. FIG. 8 is an exploded perspective view illustrating a portion of a transmission line section of the flat cable according to the fourth preferred embodiment of the present invention. FIG. 9 is a plan view illustrating a portion of the transmission line section of the flat cable according to the fourth preferred embodiment of the present invention. In FIG. 9, the dielectric element is not illustrated.

A transmission line section 10C of the flat cable according to this preferred embodiment differs from the transmission line section 10 according to the first preferred embodiment in the structures of widened portions 25C1 and 25C2, and a signal conductor 40C. Otherwise, the transmission line section 10C preferably is of the same configuration as the transmission line section 10 according to the first preferred embodiment. Therefore, only the differences from the transmission line section 10 according to the first preferred embodiment will be described.

The widened portion 25C1 is included in the elongated conductor 21, and the widened portion 25C2 is included in the elongated conductor 22. The widened portion 25C1 and the widened portion 25C2 are disposed at different positions along the longitudinal direction of the elongated conductors 21 and 22, respectively. In this regard, the respective positions of the widened portion 25C1 and widened portion 25C2 along the longitudinal direction of the elongated conductors 21 and 22 do not overlap each other at all. In other words, there is a space Gd between the edge on the widened portion 25C2 side of the widened portion 25C1 and the edge on the widened portion 25C1 side of the widened portion 25C2, along the longitudinal direction of the elongated conductors 21 and 22.

This configuration makes it possible to separate the elongated conductor 21 including the widened portion 25C1 and the elongated conductor 22 including the widened portion 25C2 from each other by a predetermined spacing or more, at any position along the longitudinal direction of the transmission line section 10C.

The signal conductor 40C preferably has a shape that meanders along the longitudinal direction of the transmission line section 10C. More specifically, in an area along the longitudinal direction where the widened portion 25C1 is located in plan view of the transmission line section 10C, the signal conductor 40C passes between the widened portion 25C1 and the elongated conductor 22. In an area along the longitudinal direction where the widened portion 25C2 is located in plan view of the transmission line section 10C, the signal conductor 40C passes between the elongated conductor 21 and the widened portion 25C2. Further, in plan view of the transmission line section 10C, in an area between the widened portions 25C1 and the 25C2 along the longitudinal direction, the signal conductor 40C passes between the widened portions 25C1 and 25C2 at substantially the same distance from the widened portions 25C1 and 25C2.

A width Wdc of the signal conductor 40C, that is, the length in a direction orthogonal to the direction in which the signal conductor 40C extends, is constant.

Because the widened portions 25C1 and the widened portion 25C2 are located at different positions along the longitudinal direction as described above, the space between the elongated conductor 21 including the widened portion 25C1 and the elongated conductor 22 including the widened portion 25C2 becomes wider than that in the configuration according to the first preferred embodiment in which the with portions 25C1 and 25C2 are opposed to each other.

Therefore, the width Wdc of the signal conductor 40C is preferably made larger than the width Wd of the signal conductor 40 according to the first preferred embodiment mentioned above, at any position along the direction in which the signal conductor 40C extends. As a result, conductor loss of the signal conductor 40C is significantly reduced or prevented, thus further improving the transmission characteristics of the transmission line section 10C.

The configuration according to this preferred embodiment can combine the configurations according to the second and third preferred embodiments mentioned above.

While the widened portion is preferably provided between every pair of adjacent bridge conductors in the preferred embodiments mentioned above, an area where the widened portion is not provided between adjacent bridge conductors may be provided partially along the longitudinal direction. The widened portion may be provided in only one of the elongated conductors 21 and 22. A plurality of widened portions may be provided between adjacent bridge conductors. The amount of projection or width of the widened portion may be varied for each position in which the widened portion is provided, and the diameter of the interlayer connection conductor may be varied accordingly.

While the above preferred embodiments are preferably directed to the case where the interlayer connection conductor is a so-called via-hole conductor obtained by filling a hole formed in an insulating sheet with a conductive paste, and changing the conductive paste to metal, this should not be construed restrictively. The interlayer connection conductor may be a so-called through-hole conductor obtained by providing the inner periphery of a hole with a plating film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flat cable comprising:
a dielectric element that has a flat plate-shape configuration and extends along a longitudinal direction;
a signal conductor that is disposed in the dielectric element and extends along the longitudinal direction;
a first ground conductor that is located on a surface at one end of a thickness direction of the dielectric element and extends along the longitudinal direction;
a second ground conductor that is located on a surface at another end of the thickness direction of the dielectric element and extends along the longitudinal direction; and
an interlayer connection conductor that extends in the thickness direction of the dielectric element and connects the first ground conductor and the second ground conductor; wherein
the first ground conductor includes:
two elongated conductors that are spaced from each other at opposite ends of a width direction;
a plurality of bridge conductors that connect the two elongated conductors at spaced points along the longitudinal direction; and
a widened portion that is located between the bridge conductors along the longitudinal direction in each of the elongated conductors, the widened portion being widened in a direction in which the two elongated conductors are opposed to each other; and
the interlayer connection conductor is located in the widened portion.

2. The flat cable according to claim 1, wherein the widened portion includes an enlarged portion configured to become gradually wider along the longitudinal direction from a width of each of the elongated conductors to a width of the widened portion.

3. The flat cable according to claim 1, wherein the widened portion is located at or substantially at a midpoint position of the bridge conductors that are adjacent to each other along the longitudinal direction.

4. The flat cable according to claim 1, wherein a position along the longitudinal direction of the widened portion included in the first elongated conductor differs from a position along the longitudinal direction of the widened portion included in the second elongated conductor.

5. The flat cable according to claim 1, wherein the interlayer connection conductor has a diameter larger than a width of each of the elongated conductors.

6. The flat cable according to claim 1, wherein each of the bridge conductors has a width smaller than a width of each of the elongated conductors.

7. The flat cable according to claim 1, wherein the signal conductor has a width that is smaller in locations adjacent to each of the bridge conductors and the widened portion than in other locations.

8. The flat cable according to claim 1, further comprising a connector member that is connected to the signal conductor and is provided at least at one end of the longitudinal direction.

9. The flat cable according to claim 8, wherein the connector member is a coaxial connector.

10. The flat cable according to claim 1, further comprising a pair of connector members that are connected to the signal conductor and provided at opposite ends of the longitudinal direction on different surfaces.

11. The flat cable according to claim 1, further comprising protective layers arranged to sandwich the dielectric element therebetween.

12. The flat cable according to claim 11, wherein the protective layers are provided over substantially entire surfaces of the dielectric element.

13. The flat cable according to claim 1, wherein the first ground conductor has a ladder-shaped configuration extending in the longitudinal direction.

14. The flat cable according to claim 1, wherein the first ground conductor includes another widened portion, and the widened portion and the another widened portion are located at opposite ends in the longitudinal direction.

15. The flat cable according to claim 1, wherein the signal conductor has an enlarged with portion in an area opposed to the bridge conductors.

16. The flat cable according to claim 1, wherein the widened portion is provided in one of the two elongated conductors and another widened portion is provided in the other of the two elongated conductors at a location different from that of the widened portion along the longitudinal direction.

17. The flat cable according to claim 16, wherein the widened portion and the another widened portion do not overlap each other along the longitudinal direction.

18. The flat cable according to claim 1, wherein the interlayer connection conductor is one of a via-hole conductor and a through-hole conductor.

19. An electronic device comprising:
the flat cable according to claim 1;
a plurality of mounting circuit boards that are connected by the flat cable; and
a housing in which the mounting circuit boards are located.

* * * * *